(12) United States Patent
Furukawa

(10) Patent No.: US 7,919,180 B2
(45) Date of Patent: *Apr. 5, 2011

(54) TREATED SUBSTRATE HAVING HYDROPHILIC REGION AND WATER REPELLENT REGION, AND PROCESS FOR PRODUCING IT

(75) Inventor: Yutaka Furukawa, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 130 days.

This patent is subject to a terminal disclaimer.

(21) Appl. No.: 12/204,847

(22) Filed: Sep. 5, 2008

(65) Prior Publication Data

US 2010/0196702 A9 Aug. 5, 2010

Related U.S. Application Data

(63) Continuation of application No. PCT/JP2007/054290, filed on Mar. 6, 2007.

(30) Foreign Application Priority Data

Mar. 6, 2006 (JP) ................................. 2006-059495

(51) Int. Cl.
*B32B 33/00* (2006.01)
*B32B 17/06* (2006.01)
(52) U.S. Cl. ......... 428/336; 428/421; 428/447; 428/451
(58) Field of Classification Search ............... 428/336, 428/421, 447, 451
See application file for complete search history.

(56) References Cited

U.S. PATENT DOCUMENTS 6,352,758 B1 * 3/2002 Huang et al. ............... 428/143
2006/0003256 A1 1/2006 Takahashi et al. ......... 430/270.1

FOREIGN PATENT DOCUMENTS

| JP | 11-344804 | 12/1999 |
| JP | 2000-282240 | 10/2000 |
| JP | 2004-259868 | 9/2004 |
| WO | 2004-079454 | 9/2004 |

OTHER PUBLICATIONS

U.S. Appl. No. 12/365,970, filed Feb. 5, 2009, Hoshino, et al.
U.S. Appl. No. 12/551,863, filed Sep. 1, 2009, Furukawa.

* cited by examiner

*Primary Examiner* — D. S Nakarani
(74) *Attorney, Agent, or Firm* — Oblon, Spivak, McClelland, Maier & Neustadt, L.L.P.

(57) ABSTRACT

A treated substrate having a hydrophilic region and a water repellent region, of which contrast is high on its surface; a process for producing a treated substrate, wherein the treated substrate can be produced with a low amount of light for a short time; wherein the water repellent region is made of a water repellent film formed by curing the composition (A) comprising a photopolymerization initiator and a compound (a) having at least one (meth)acryloyl group, and a water repellent moiety and having a film thickness of from 0.1 to 100 nm; the process uses a hydrophilic substrate or makes the surface thereof hydrophilic, then forms a film containing the composition (A) on the surface, then forms said water repellent film by irradiating light on a part of the film surface to cure the composition (A) and then removes an uncured composition (A) present thereon in order to expose the hydrophilic surface.

12 Claims, No Drawings

TREATED SUBSTRATE HAVING HYDROPHILIC REGION AND WATER REPELLENT REGION, AND PROCESS FOR PRODUCING IT

TECHNICAL FIELD

The present invention relates to a treated substrate having a hydrophilic region and a water repellent region on a surface of a substrate, a process for producing it and a process for producing a member on which a pattern of a film made of a functional material is formed by using the treated substrate.

BACKGROUND ART

Many functional thin films are practically used in the fields of semiconductor devices, displays and luminescent elements. Functional thin films are formed by disposing a material having a desired property at a desired position, followed by patterning. The functional thin films are used as wiring, electrodes, insulating layers, luminescence layers, optical thin films, etc.

For example, a photoresist pattern obtained by photolithography may be mentioned. However, processes of the photolithography are complex, and utilization efficiency of energy, material, etc. is low. Further, there is a problem such that since the processes of the photolithography are carried out in a clean room, cost of facilities is expensive.

As a method to solve the problems of the photolithography, an ink-jet print method has been proposed. However, in the ink-jet print method, position accuracy is low, and it is difficult to form a fine pattern. Under the circumstance, the following methods (1) and (2) have been proposed to improve the position accuracy by preliminarily forming on a substrate surface a base film having a water repellent region which repels ink and a hydrophilic region which accepts ink.

(1) A method wherein a photocatalyst such as titanium oxide is activated at a time of exposure to change a wet property of a surfactant, or a photocatalyst decomposable substance is decomposed and removed, thereby to form a pattern which accepts or repels printing ink or a toner (Patent Document 1). Paten Document 1 discloses that in a silicon resin having a siloxane bond (—Si—O—) as a main skeleton to be used as a binder for a photocatalyst, an organic group bonded to a silicon atom is substituted with an oxygen-containing group by action of the photocatalyst, whereby the wet property is improved.

(2) A method wherein a surface of a substrate is subjected to a hydrophilic treatment, and then a pattern of an organic monomolecular film of a fluorinated alkylsilane is formed by chemical vapor deposition, whereby the monomolecular film becomes a resist film for etching (Patent Document 2). Patent document 2 discloses a method wherein hydrophilic treatment is carried out by irradiating a surface of a substrate such as a single crystal silicon (natural oxidation surface $SiO_2$), a polyethylene film or glass with ultraviolet light of $Xe_2$ excimer laser (172 nm) or oxygen plasma. Further, it is disclosed that the organic monomolecular film of a fluorinated alkylsilane is formed by applying ultraviolet light (172 nm) or electron beam.

Patent Document 1 JP-A-11-344804
Patent Document 2 JP-A-2000-282240

DISCLOSURE OF THE INVENTION

Problems to be Solved by the Invention

In such conventional methods, high energy light having a wavelength of lower than 200 nm is required, and light irradiation for a long time is required. Further, special equipments such as a large facility, a vacuum apparatus and a high energy light source are required in such conventional methods. Further, since a high energy light having a wavelength of at most 200 nm is used, an organic compound in a thin film of a pattern is also decomposed, and the contrast between a hydrophilic region and a water repellent region in the pattern tends to be low.

It is an object of the present invention to provide a treated substrate having a hydrophilic region and a water repellent region, of which the contrast is high on a surface of a substrate. It is also an object of the present invention to provide a process for producing the treated substrate, wherein a special equipment, high energy light or light irradiation for a long time is not required, and the treated substrate can be produced with a low amount of light for a short time. Further, it is an object of the present invention to provide a member on which a pattern of a film made of a functional material is formed by employing the treated substrate.

Means to Accomplish the Objects

The above objects can be accomplished by the following invention.

(1) A treated substrate having a hydrophilic region and a water repellent region on a surface of a substrate, characterized in that the water repellent region is made of a water repellent film formed by curing the following composition (A) and having a film thickness of from 0.1 to 100 nm:

composition (A): a composition comprising a photopolymerization initiator and a compound (a) having at least one polymerizable functional group selected from the group consisting of an acryloyl group and a methacryloyl group, and a water repellent moiety.

(2) The treated substrate according to the above (1), wherein the compound (a) is a compound represented by the following formula (11), (12), (21) or (22):

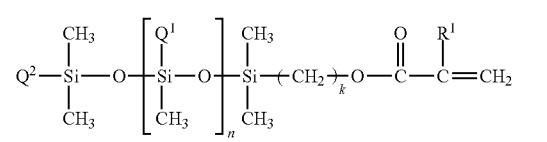

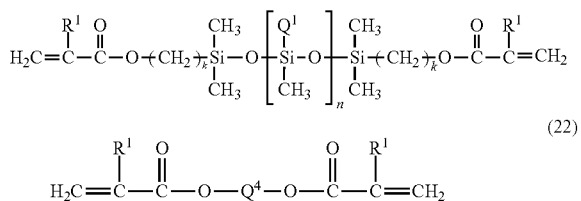

where each of $Q^1$ and $Q^2$ which are independent of each other, is a monovalent organic group, $Q^3$ is an alkyl group having at least four carbon atoms, a monovalent organic group having the above alkyl group as a partial structure, a fluoroalkyl group having at least one carbon atom, which may contain an etheric oxygen atom, or a monovalent organic group having the above fluoroalkyl group as a partial structure, $Q^4$ is an alkylene group having at least four carbon atoms, a bivalent organic group having the above alkylene group as a partial structure, a fluoroalkylene group having at least two carbon atoms, which may contain an etheric oxygen atom, or a bivalent organic group having the above fluoroalkylene group as a partial structure, $R^1$ is a hydrogen atom or a methyl group, n is an integer of at least 0, and k is an integer of from 1 to 5.

(3) The treated substrate according to the above (1) or (2), wherein the composition (A) contains a compound (b) having at least three polymerizable functional groups selected from the group consisting of an acryloyl group and a methacryloyl group, provided that the compound (b) may be the same as the compound (a) or a compound other than the compound (a).

(4) The treated substrate according to any one of the above (1) to (3), wherein the contact angle of the hydrophilic region to water is at most 50°, and the contact angle of the water repellent region to water is at least 80°.

(5) The treated substrate according to any one of the above (1) to (4), wherein the hydrophilic region and the water repellent region have a predetermined pattern.

(6) A process for producing a treated substrate, characterized by using a hydrophilic substrate or carrying out a hydrophilic treatment on a surface of a substrate to make the surface hydrophilic, then forming a film containing the following composition (A) on the surface, then forming a water repellent film having a film thickness of from 0.1 to 100 nm by applying light on a part of the film surface to cure the composition (A) and then removing an uncured composition (A) present on the surface of the substrate in order to expose the hydrophilic surface, to obtain a treated substrate having a hydrophilic region and a water repellent region made of a water repellent film formed by curing the compound (A) on the surface of the substrate:

composition (A): a composition comprising a photopolymerization initiator and a compound (a) having at least one polymerizable functional group selected from the group consisting of an acryloyl group and a methacryloyl group, and a water repellent moiety.

(7) The process according to the above (6), wherein the surface of the substrate is subjected to the hydrophilic treatment by subjecting the surface of the hydrophilic substrate to wet-washing or photo-washing, or by applying a hydrophilic compound on the surface of the substrate.

(8) A process for producing a treated substrate, is characterized by forming a film containing a hydrophilic compound and the following composition (A) on a surface of a substrate, leaving it to stand still to make the hydrophilic compound move to the substrate side, then applying light on a part of the film surface to cure the composition (A) to form a water repellent film having a film thickness of from 0.1 to 100 nm, and then removing an uncured composition (A) present on the surface of the substrate in order to expose a hydrophilic surface, to obtain a treated substrate having a hydrophilic region and a water repellent region made of a water repellent film formed by curing the composition (A) on the surface of the substrate:

composition (A): a composition comprising a photopolymerization initiator and a compound (a) having at least one polymerizable functional group selected from the group consisting of an acryloyl group and a methacryloyl group, and a water repellent moiety.

(9) The process according to any one of the above (6) to (8), wherein light having a wavelength of at least 200 nm is applied.

(10) A process for producing a member on which a pattern of a film made of a functional material is formed, characterized by applying a hydrophilic liquid containing a functional material on a surface of the treated substrate as defined in the above (5) in order to coat the hydrophilic region having a pattern of the treated substrate with the hydrophilic liquid, followed by drying to form a pattern of a film made of the functional material.

(11) A process for producing a member on which a pattern of a film made of a functional material is formed, characterized by applying a hydrophilic liquid containing a functional material on a surface of the treated substrate as defined in the above (5) in order to coat the hydrophilic region having a pattern of the treated substrate with the hydrophilic liquid, followed by drying to form a pattern of a film made of the functional material, and removing the water repellent film formed by curing the composition (A).

EFFECT OF THE INVENTION

By the present invention, a treated substrate having a hydrophilic region and a water repellent region, of which the contrast is high on its surface can be obtained. Further, without using a large facility, a vacuum apparatus and a high energy light source, the treated substrate can be produced. Namely, the treated substrate can be produced by using a simple apparatus and a simple light source with a low light amount in a short time.

Further, by using the treated substrate of the present invention, a member on which a pattern of a film made of a functional material is formed can be obtained, and the treated substrate of the present invention can be used for various applications.

BEST MODE FOR CARRYING OUT THE INVENTION

Hereinafter, a polymerizable functional group selected from the group consisting of an acryloyl group and a methacryloyl group is referred to as "(meth)acryloyl group". Further, a (meth)acrylate means an acrylate or a methacrylate In the present specification, a compound represented by the formula (11) is referred to as "compound (11)". Compounds represented by other formulae are also referred to in the same manner.

A substrate used in the present invention can be selected from substrates made of glass; a silicon wafer; a metal such as Pd, Pt, Ru, Ag, Au, Ti, In, Cu, Cr, Fe, Zn, Sn, Ta, W or Pd; a metal oxide such as PdO, $SnO_2$, $In_2O_3$, PbO, or $Sb_2O_3$; a boride such as $HfB_2$, $ZrB_2$, $LaB_2$, $CeB_6$, $YB_4$ or $GdB_4$; a carbide such as TiC, ZrC, HfC, TaC, SiC or WC; a nitride such as TiN, ZrN or HfN; a semiconductor such as Si or Ge; and a resin such as a polyimide, a polystyrene, a polyethylene terephtalate or a polytetrafluorethylene. The substrate may be a substrate made of a hydrophilic material, of which the surface is hydrophilic or a substrate made of a non-hydrophilic (hydrophobic) material, of which the surface is not hydrophilic. The glass, the silicon wafer, the metal oxide and the polyimide are preferred. Among them, the glass, the silicon wafer and the metal oxide are usually hydrophilic materials.

The shape of the substrate is not particularly limited and it preferably has a flat surface, a curved surface or a flat surface having a partially curved surface, and a flat surface is more preferred. Further, the area of the substrate is not particularly limited, and as far as conventional coating methods can be applied, the area of a substrate is not limited. Further, the surface treatment of the substrate of the present invention is preferably carried out on one surface of a flat substrate.

The process for producing the treated substrate of the present invention contains the following step (1) or (2).

(1) Step of using a hydrophilic substrate or carrying out a hydrophilic treatment on a surface of a substrate to make the surface hydrophilic and then forming on the surface a film containing the composition (A) comprising a photopolymerization initiator and a compound (a) having at least one (meth) acryloyl group, and a water repellent moiety.

(2) Step of forming a film containing a hydrophilic compound and the following composition (A) on a surface of a substrate and leaving it to stand still to make the hydrophilic compound move to the substrate side.

After the above step (1) or (2), a part of the film surface is irradiated with light to cure the composition (A) to form a water repellent film having a film thickness of from 0.1 to 100 nm, and then an uncured composition (A) present on the surface of the substrate is removed to expose a hydrophilic surface, whereby the treated substrate of the present invention can be obtained.

First, the above step (1) will be explained. It is preferred to clean the surface of a substrate by washing or the like before use. A substrate made of a hydrophilic material and having a hydrophilic surface can be used as it is. A substrate having a non-hydrophilic surface is subjected to hydrophilic treatment before use. The hydrophilic treatment can also be carried out on a surface of a substrate having a hydrophilic surface before use. As a method for washing the surface of a substrate, conventional methods for washing the surface of plastics, metals, glass, ceramics, etc. can be employed. As the washing method, a method of wet-washing the surface of a substrate, a method of photo-washing the surface of a substrate or the like is preferred. As a method for the hydrophilic treatment of the surface of a substrate, conventional methods for hydrophilic treatment of the surface of plastics, metals, glass, ceramics, etc. can be employed. As the hydrophilic treatment method, a method wherein a compound which reacts on the surface to form a hydrophilic surface is used, a method wherein the surface of a substrate is coated with a hydrophilic compound to form a layer of the hydrophilic compound or a method wherein the above methods are combined may, for example, be mentioned.

For the wet-washing of a substrate, water, a water type detergent or a non-water type detergent (an organic solvent, a fluorine type solvent, etc.) may be used. Particularly, a method is preferred wherein a substrate is washed with water or a water type detergent containing a surfactant, and then the substrate is dried, while contaminates, moisture, etc. on a surface are removed by using an organic solvent having a low boiling point such as isopropyl alcohol or ethyl alcohol. Further, depending on the type of a substrate, or the type or degree of stain, a step may be added, or a part of step may be omitted. It is preferred that in order to wet-wash a substrate with an organic stain, the substrate is preliminarily washed with an organic solvent such as dichloropentafluoropropane (AK-225, manufactured by Asahi Glass Company, Limited: a mixture of $CF_3CF_2CHCl_2$ and $CF_2CHClF$) to remove the stain, and then the substrate is immerse-washed with a water type detergent or an organic detergent. At the time of the immerse-washing, ultrasonic washing may be carried out in combination. In the case of glass, instead of the immerse-washing or with the immerse-washing, a method of polish washing with an abrasive containing cerium oxide fine particles, followed by rinsing the substrate with pure water and then by air-drying may be employed.

As the method of photo-washing a substrate, $UV/O_3$ washing (photo-washing with ultraviolet light, ozone or their combination) is preferred. The mechanism of the $UV/O_3$ washing is such that washing is carried out by (1) cleaving bonds of the main component (organic matter) of stain by ultraviolet light having high photon energy, so that the bonds of the stain become fragile and (2) in such a state, reacting ozone or active oxygen, so that the organic matter is oxidized to carbon dioxide, water, etc, and evaporated. Thus, the later method is preferred, since ultraviolet light and ozone may be used alone or in combination to clean the surface. A commercially available $UV/O_3$ washing apparatus may be used.

Further, only by the wet-washing, fine organic stains (for example, residues of the surfactant in a detergent or suspended matters in the clean room) are likely to remain. On the other hand, the above photo-washing is free from the problem of the fine organic stains. Accordingly, a method is preferred wherein at first, relatively large stains are removed by the wet-washing, and then washing is carried out by the photo-washing.

The hydrophilic compound which may be used in the hydrophilic treatment of the surface of a substrate may, for example, be a hydrophilic polymer such as a poly(vinyl alcohol), a poly(vinyl pyrrolidone) or a poly(ethylene glycol) or a polyhydric alcohol such as glycerin, pentaerythritol or sorbitol. The compound which reacts on the surface to make the surface hydrophilic may, for example, be a hydrolyzable silane compound such as $H—Si(OCH_2CH_3)_3$ or $NH_2CH_2CH_2CH_2—Si(OCH_2CH_3)_3$, a compound having said compound partially or entirely hydrolyzed or a hydrolytic condensate of the above compound.

It is preferred that the hydrophilic compound is applied in the form of a solution dissolved in a solvent and dried to form a layer of the hydrophilic compound. The hydrophilic polymer and the polyhydric alcohol are preferably dissolved in water and used as an aqueous solution. The hydrolyzable silane compound is preferably dissolved in an alcohol solvent such as isopropyl alcohol for use. The concentration of the hydrophilic polymer or the hydrolyzable silane compound in the solution is preferably from 0.01 to 10 mass %, more preferably from 0.1 to 1 mass %.

The coating method of a substrate is not particularly limited, and a spin coating method, a dip coating method, a spray coating method, a roll coating method, a meniscus coating method and a screen printing method may be employed.

In a case where the surface of a substrate is made of various different materials, it is preferred to employ a method of subjecting the surface of a substrate to hydrophilic treatment. Because, the same hydrophilic property can be imparted to the surface made of various materials.

Next, a film containing the composition (A) is formed on the hydrophilic surface of the substrate. The composition (A) contains a photopolymerization initiator and a compound (a) having at least one (meth)acryloyl group and a water repellent moiety. The (meth)acryloyl group of the compound (a) may be at any position in the molecule, however, it is preferably present at a terminal of the molecule. If it is present at a terminal of the molecule, reactivity is high.

The water repellent moiety of the compound (a) is preferably a monovalent or bivalent water repellent group. The monovalent water repellent group is preferably a monovalent group having an organopolysiloxane skeleton, an alkyl group having at least four carbons or a $C_{1-12}$ fluoroalkyl group which may contain an etheric oxygen atom. The bivalent water repellent group is preferably a bivalent group having an organopolysiloxane skeleton, an alkylene group having at least four carbons or a $C_{2-12}$ fluoroalkylene group which may contain an etheric oxygen atom.

The organopolysiloxane skeleton has a polysiloxane skeleton and an organic group bonded to a silicon atom which forms the skeleton. The organic group bonded to a silicon atom is bonded by a carbon-silicon bond. Namely, a terminal atom of the organic group, which is bonded to a silicon atom is a carbon atom. At least one organic group is bonded to the silicon atom in the organopolysiloxane skeleton, and in many cases, except for a terminal silicon atom, one or two organic groups are bonded to the silicon atom. In the case of the monovalent group having an organopolysiloxane skeleton, at most three organic groups are bonded to a terminal silicon atom. In the present invention, the organopolysiloxane skeleton preferably has a linear structure having no branch or a linear structure having a few branches.

The organic group bonded to the above silicon atom is preferably a hydrocarbon group or a fluoroorganic group. The hydrocarbon group is preferably an alkyl group, an alkenyl group, an alkynyl group or an aryl group. From the viewpoint of availability, the organic group bonded to a silicon atom is preferably an alkyl group having at most four carbon atoms, an alkenyl group having at most four carbon atoms, an alkynyl group having at most four carbon atoms or an aryl group having at most 8 carbon atoms. Among them, a methyl group, an ethyl group and a phenyl group are preferred, and the methyl group is particularly preferred. Further, from the viewpoint of improving the water repellent property of the organopolysiloxane skeleton, the organic group bonded to a silicon atom is preferably a $C_{5-20}$ linear alkyl group or a $C_{5-20}$ linear alkenyl group, particularly preferably a $C_{6-16}$ linear alkyl group. Further, from the viewpoint of improving the water repellent property of the organopolysiloxane skeleton, the organic group bonded to a silicon atom is preferably a fluoroorganic group, and a polyfluoroalkyl group which may contain an etheric oxygen is more preferred. Particularly preferred are a polyfluoroalkyl group having a difluororoethylene chain and a polyfluoroalkyl group having a perfluorooxyalkylene group.

The compound (a) may, for example, be a compound having one (meth)acryloyl group and a monovalent water repellent group or a compound having two (meth)acryloyl groups and a bivalent water repellent groups. The former compound may, for example, be the compound (11) or the compound (12), and the latter compound may, for example, be the compound (21) or the compound (22). The symbols in the formulae are the same as defined above.

(11)
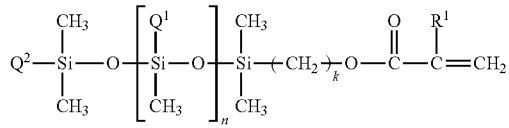

(12)
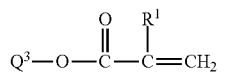

(21)
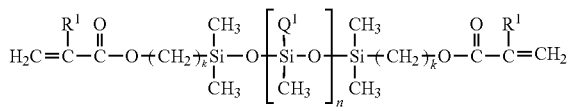

(22)
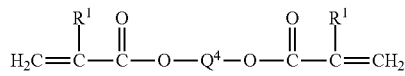

In the case of the compound (11), the water repellent moiety is a monovalent group having an organopolysiloxane skeleton, in the case of the compound (12), the water repellent moiety is $Q^3$, in the case of the compound (21), the water repellent moiety is a bivalent group having an organopolysiloxane skeleton, and in the case of the compound (22), the water repellent moiety is $Q^4$.

In the above formulae, each of $Q^1$ and $Q^2$ which are independent of each other, is a monovalent organic group, preferably a monovalent hydrocarbon group which may contain a fluorine atom, more preferably a $C_{1-4}$ alkyl group, particularly preferably a methyl group. In a case where a plurality of $Q^1$ are present (in a case where n is at least 2), the plurality of $Q^1$ may be different from one another. The same applies to $Q^2$.

$R^1$ is a hydrogen atom or a methyl group. n is an integer of at least 0, preferably an integer of at least 1, and preferably an integer such that the molecular weight of a compound will be from 500 to 1,000,000. k is an integer of from 1 to 5, preferably an integer of from 2 to 4, more preferably 3.

In the above formulae, $Q^3$ is an alkyl group having at least four carbon atoms, a monovalent organic group having the above alkyl group as a partial structure, a fluoroalkyl group having at least one carbon atom, which may contain an etheric oxygen atom or a monovalent organic group having the above fluoroalkyl group as a partial structure.

In a case where $Q^3$ is an alkyl group having at least four carbon atoms or a monovalent organic group having the above alkyl group as a partial structure, an alkyl group having at least four carbon atoms is preferred, and a $C_{4-18}$ alkyl group is more preferred. In a case where the number of carbon atoms is within the above range, an excellent water repellent property can be obtained. The alkyl group may have a linear structure, a branched structure, a ring structure or a partial ring structure, and the linear structure is preferred.

As examples of $Q^3$ which is the alkyl group having at least four carbon atoms, the following may be mentioned.

$H(CH_2)_4$—, $H(CH_2)_6$—, $H(CH_2)_8$—, $H(CH_2)_{10}$—, $H(CH_2)_{12}$—, $H(CH_2)_{14}$—, $H(CH_2)_{16}$—, $H(CH_2)_{18}$—

In a case where $Q^3$ is a fluoroalkyl group having at least one carbon atom, which may contain an etheric oxygen atom or a monovalent organic group having the above fluoroalkyl group as a partial structure, a group represented by $R^{f1}$—Y— is preferred ($R^{f1}$ is a fluoroalkyl group having at least one carbon atom, which may contain an etheric oxygen atom, and Y is a bivalent coupling group containing no fluorine atom).

$R^{f1}$ is preferably a $C_{1-12}$ fluoroalkyl group which may contain an etheric oxygen atom, more preferably a $C_{1-12}$ perfluoroalkyl group which may contain an etheric oxygen atom, particularly preferably a $C_{3-12}$ perfluoroalkyl group which may contain an etheric oxygen atom. The structure of $R^{f1}$ may be a linear structure, a branch structure, a ring structure or a partial ring structure, and the linear structure is preferred.

As specific examples of $R^{f1}$, the following groups may be mentioned.

$F(CF_2)_4$—, $F(CF_2)_6$—, $F(CF_2)_8$—, $H(CF_2)_4$—, $H(CF_2)_6$—, $H(CF_2)_8$—; $CF_3CF_2OCF_2CF_2OCF_2$—, $CF_3CF_2OCF_2CF_2OCF_2CF_2$—, $CF_3CF_2OCF_2CF_2OCF_2CF_2OCF_2CF_2OCF_2$—, $CF_3CF_2OCF_2CF_2OCF_2CF_2OCF_2CF_2OCF_2CF_2$—; $CF_3CF_2CF_2OCF_2$—, $CF_3CF_2CF_2OCF_2CF_2$—, $CF_3CF_2CF_2OCF$ $(CF_3)$—, $CF_3CF_2CF_2OCF(CF_3)CF_2$—, $CF_3CF_2CF_2OCF(CF_3)CF_2OCF_2CF_2$—, $CF_3CF_2CF_2OCF$ $(CF_3)CF_2OCF$ $(CF_3)$—, $CF_3CF_2CF_2OCF(CF_3)CF_2OCF$ $(CF_3)CF_2$—.

Y is preferably a group represented by —$(CF_2)_m$—, —$SO_2NR^2$—$(CH_2)_m$— or —$(C=O)$—$NR^2$—$(CH_2)_m$—. m is an integer of from 1 to 5, and $R^2$ is a hydrogen atom, a methyl group or an ethyl group.

$Q^4$ may be an alkylene group having at least four carbon atoms, a bivalent organic group having the above alkylene group as a partial structure, a fluoroalkylene group having at least two carbon atoms, which may contain an etheric oxygen atom, or a bivalent organic group having the above fluoroalkylene group as a partial structure.

In a case where $Q^4$ is an alkylene group having at least four carbon atoms or a bivalent organic group having the above alkylene group as a partial structure, an alkylene group having at least four carbon atoms is preferred, and a $C_{4-18}$ alkylene group is more preferred. Such groups are excellent in the water repellent property. The alkylene group may have a linear structure, a branch structure, a ring structure or a partial ring structure, and the linear structure is preferred.

As specific examples in a case where $Q^4$ is an alkylene group having at least four carbon atoms, the following groups may be mentioned.

—$(CH_2)_4$—, —$(CH_2)_6$—, —$(CH_2)_8$—, —$(CH_2)_{10}$—, —$(CH_2)_{12}$—, —$(CH_2)_{14}$—, —$(CH_2)_{16}$—, —$(CH_2)_{18}$—.

In a case where $Q^4$ is a fluoroalkylene group having at least two carbon atoms, which may contain an etheric oxygen atom or a bivalent organic group having the above fluoroalkylene group as a partial structure, a $C_{2-12}$ fluoroalkylene group which may contain an etheric oxygen atom is preferred, and a $C_{2-12}$ perfluoroalkylene group which may contain an etheric oxygen atom is more preferred.

The fluoroalkylene group which may contain an etheric oxygen atom may have a linear structure, a branch structure, a ring structure or a partial ring structure, and the linear structure is preferred.

As specific examples in a case where $Q^4$ is a fluoroalkylene group having at least two carbon atoms, which may contain an etheric oxygen atom, the following groups may be mentioned.

—$(CF_2)_2$—, —$(CF_2)_4$—, —$(CF_2)_6$—, —$(CF_2)_8$—, —$(CF_3)CF[OCF_2CF(CF_3)]OCF_2(CF_2)_4CF_2O[CF(CF_3)CF_2O]CF(CF_3)$—, —$CF_2CF_2OCF_2(CF_3)CF_2[OCF_2CF(CF_3)]OCF_2$—, —$(CF_2)_4CF_2O[CF(CF_3)CF_2O]CF(CF_3)CF_2OCF_2CF_2$—.

The compound (a) is preferably the compound (11), the compound (12) or the compound (21). In view of the excellent water repellent property, it is more preferred to use the compound (11) wherein each of $Q^1$ and $Q^2$ is a methyl group, the compound (21) wherein $Q^1$ is a methyl group or the compound (12) wherein $Q^3$ is a group represented by $R^{f1}$—Y—, and $R^{f1}$ is a $C_{1-12}$ perfluoroalkyl group, are preferably used.

Further, in the case of the compound (11) wherein each of $Q^1$ and $Q^2$ is a methyl group or the compound (21) wherein $Q^1$ is a methyl group, a compound having a molecular weight of from 500 to 1,000,000 is particularly preferred, and the compound having a molecular weight of from 1,000 to 1,000,000 is especially preferred. The compound (11) or the compound (21) is usually available as a mixture of two or more compounds, of which n is different. n may sometimes be represented by an average value of n in the mixture, and in such a case, n is a positive number. In the compound (11) or the compound (21), if the molecular weight is at least 500, evaporation from the surface of a substrate can be prevented, and if the molecular weight is lower than 1,000,000, the solubility of the compound to a solvent is improved, whereby the work efficiency is improved.

The photopolymerization initiator is a substance which absorbs light and generates radicals to initiate the polymerization reaction and is selected from substances which initiate the polymerization of a (meth)acryloyl group.

For example, 2-hydroxy-2-methyl-1-phenylpropan-1-one (Dalocure 1173, manufactured by Merck Ltd.), 1-hydroxycyclohexyl-phenyl-ketone (Irgacure 184, manufactured by CIBA-GEIGY Limited), 1-(4-isopropylphenyl)-2-hydroxy-2-methylpropan-1-one (Dalocure 1116, manufactured by Merck Ltd.), benzodimethyl ketal (Irgacure 651, manufactured by CIBA-GEIGY Limited), 2-methyl-1-(4-methylthio)phenyl-2-morphorlinopropanon-1-one (Irgacure 907, manufactured by CIBA-GEIGY Limited), 2-Benzyl-2-dimethylamino-1-(4-morpholinophenyl) butanone-1 (Irgacure 369, manufactured by CIBA-GEIGY Limited) or 2,4-diethyl thioxanthone (KAYACURE DETX, manufactured by Nippon Kayaku Co., Ltd.) may preferably mentioned. They may be used alone or as a mixture of two or more. The amount of the photopolymerization initiator is preferably from 0.1 to 50 mass %, more preferably from 1 to 10 mass %, based on the total amount of the compound (a).

The compound (A) preferably contains a compound (b) having at least three (meth)acryloyl groups, provided that the compound (b) may be the same as the compound (a) or a compound other than the compound (a). Namely, the compound (b) which is the compound (a) means a compound having at least three (meth)acryloyl groups and a water repellent moiety, and the compound (b) which is other than the compound (a) means a compound having at least three (meth)acryloyl groups and no water repellent moiety. Use of the compound (b) having at least three (meth)acryloyl groups is effective to accelerate the curing of the composition (A).

The compound (b) which is other than the compound (a) is preferably a poly(meth)acrylate which is a tri or more valent polyol. The number of the (meth)acryloyl groups in one molecule is preferably at most 8. Specifically, pentaerythritol tri(meth)acrylate, pentaerythritol tetra(meth)acrylate, dipentaerythritol penta(meth)acrylate, dipentaerythritol hexa(meth)acrylate, trimethylolpropane tri(meth)acrylate, ditrimethylolpropane tetra(meth)acrylate or the like may be mentioned. The amount of the compound (b) which is other than the compound (a) in the composition (A) is preferably from 0.1 to 100 mass %, more preferably from 5 to 50 mass %, based on the total amount of the compound (a). If the amount of the compound (b) is excessive, the water repellent property of a water repellent region of a film formed by curing the composition (A) may sometimes deteriorate.

Next, the above step (2) will be explained. The composition (A) is mixed with the above hydrophilic compound, and the surface of a substrate is coated with the mixture to form a film, followed by leaving it to stand still to make the hydrophilic compound move to the substrate side. Since the compound having a hydrophilic moiety is a material of a high energy surface, it orientates to the substrate side, and since the compound having a water repellent moiety is a material of a low energy surface, it tends to orientate to the gas phase interface. By utilizing such characteristics, it is possible to form a bilayer structure of the hydrophilic compound and the compound (a).

The amount of the hydrophilic compound is preferably from 0.1 to 100 mass %, more preferably from 1 to 60 mass %, based on the amount of the compound (a). Condition to leave the substrate to stand still is changed, depending on the type of the compound (a), the type of the hydrophilic compound and the film thickness. A substrate coated with a material may be heated to accelerate this phenomenon. By heating an applied hydrophilic compound and/or compound (a) to at least a glass transition temperature, a bilayer structure can be formed in a short time at a level of from a few seconds to a few minutes.

Instead of the hydrophilic compound, a compound which reacts to a surface to make the surface hydrophilic may be used, and the compound is made to be moved to the surface of the substrate in the same manner and reacted with the substrate surface so that the substrate surface becomes hydrophilic. The amount of the compound or condition to use the compound is the same as in the case of the hydrophilic compound.

The composition (A) in the step (1) and the hydrophilic compound, the composition(A), etc. in the step (2) are applied preferably in the form of a solution containing a solvent. The solvent is preferably an alcohol such as methanol, ethanol or isopropanol, an ester such as ethyl acetate or butyl acetate or a hydrocarbon such as hexane. The solid component concentration in the solution is preferably from 0.01 to 50 mass %, more preferably from 0.1 to 10 mass %.

As a method to form a film, a method to coat a substrate surface with the above solution is preferred, and a spin coating method, a dip coating method, a wire bar coating method, a blade coating method or a roll coating method may be employed. The coating may be carried out at room temperature or under heating. Further, a substrate on which a film has been formed is preferably dried under nitrogen stream or the like. The drying is preferably carried out at room temperature. In a case where the drying is carried out under heating, it is preferred that temperature and time are adjusted, depending on the heat resistance of the material of a substrate.

After a film is formed, a part of the film is irradiated with light. Light used for irradiation preferably has a wavelength of at least 200 nm, more preferably a wavelength of at least 300 nm. Further, light having a wavelength of at most 380 nm is preferred, and light having a wavelength of at most 365 nm is more preferred. When the wavelength of light is at least 200 nm, decomposition of a substrate can be prevented in most cases. Further, a photopolymerization initiator which initiate polymerization with light having a wavelength of at most 380 nm is easily available, and the light source is also not expensive. Irradiation time is properly changed, depending on the wavelength of light, the intensity of light, the type of light, the type of the composition (A), etc. In a case of an ultrahigh-pressure mercury lamp, irradiation time is from 5 to 120 seconds with from 2 to 100 mw/cm$^2$. In general, irradiation time with a high-pressure mercury lamp is shorter than that with an ultrahigh-pressure mercury lamp.

As the light source, a low-pressure mercury lamp, a high-pressure mercury lamp, an ultrahigh-pressure mercury lamp, a xenon lamp, a sodium lamp, a gas laser such as nitrogen, a liquid laser of an organic dye solution or a solid-state laser having a rare earth element ion contained in an inorganic single crystal may, for example, be mentioned. Further, as a light source other than a laser capable of providing a monochromatic light, an ultraviolet light having a desired wavelength, which is obtained by subjecting a broadband line spectrum or a continuous spectrum to an optical filter such as a band-pass filter and a cut-off filter, may be used. Since a large area can be irradiated with light at once, a high-pressure mercury lamp or an ultrahigh-pressure mercury lamp is preferred as the light source.

Light irradiation is preferably carried out through a photomask. By this method, the curing reaction can be carried out only at a desired region on a film surface, and a treated substrate on which a desired pattern of a hydrophilic region and a water repellent region is formed can be obtained.

The atmosphere for light irradiation can be optionally selected. In a case where a water repellent film having a thickness of at most 100 nm is formed by curing the composition (A), since cure inhibition due to oxygen may sometimes occur, light irradiation is preferably carried out under an inert gas atmosphere such as nitrogen. The inert gas may, for example, be a gas selected from nitrogen, argon, helium and carbon dioxide, and nitrogen gas is preferred, since it is inexpensive.

Light irradiation may be carried out from either side of a substrate, as long as light has a wavelength which can transmit through a substrate. Usually, it is preferred to apply light from the side of a film containing the composition (A).

After a water repellent film is formed by curing the composition (A), an uncured composition (A) remained on the substrate surface is removed. By removing the uncured composition (A), a hydrophilic surface is exposed. As a method for removing the uncured composition (A), in a case where the molecular weight of the composition (A) is low, it is preferred to remove the uncured composition (A) by blowing nitrogen stream. In a case where the molecular weight of the composition (A) is high, since the composition (A) is not likely to evaporate, it is preferred to wash the surface on which the uncured composition (A) remains with an organic solvent. The organic solvent to be used for washing is preferably a solvent which dissolves the composition (a). The organic solvent may, for example, be an alcohol such as methanol, ethanol or isopropanol, an ester such as ethyl acetate or butyl acetate or a hydrocarbon such as hexane.

The film thickness of the water repellent film is from 0.1 to 100 nm, preferably from 0.1 to 50 nm, more preferably from 0.1 to 10 nm. Particularly, in a case where the treated substrate of the present invention is used for an electronic member, a thin water repellent film is preferred. A member on which a pattern of a film made of a functional material is formed by coating a surface of the treated substrate of the present invention with a hydrophilic solution containing a functional material to coat the hydrophilic region of the treated substrate on which a pattern is formed with the hydrophilic liquid, followed by drying to form a pattern of a film made of the functional material, and removing the water repellent film formed by curing the composition (A). The member is useful for an electronic element. The water repellent film formed by curing the composition (A) is removed, because in a case where the member is used for an electronic element, the water repellent film may influence the operation of the element. Accordingly, a thin water repellent film is preferred from the viewpoint of removing the film easily.

By the present invention, a treated substrate having a hydrophilic region and a water repellent region made of a water repellent film formed by curing the composition (A) on a surface of a substrate, can be provided. The hydrophilic region can be distinguished from the water repellent region by contact angle to water. In the present specification, the contact angle is represented by a measured value obtained by a sessile drop method. The contact angle to water of the hydrophilic region is preferably at most 50°, more preferably at most 40°, particularly preferably at most 20°. The contact angle to water of the water repellent region is preferably at least 80°, more preferably at least 100°, particularly preferably at least 110°. The difference in the contact angle to water between the water repellent region and the hydrophilic region is preferably at least 40°, more preferably at least 70°. The larger the difference is, the higher the contrast of the pattern can be obtained.

Further, in a case where a fluorine-containing compound is used as the compound (a), the water repellent region also has an oil repellent property. The oil repellent region can repel a lipophilic solvent (such as a hydrocarbon solvent), whereby if a lipophilic solvent is used as a solvent for a functional material for forming a functional film, it can be prevented that the water repellent region is stained with the functional material.

Further, it is possible to impart affinity to a lipophilic solvent to the hydrophilic region. The oil repellent region can be distinguished from the hydrophilic region by contact angle to hydrocarbon compounds. Specifically, in a case where hexadecane is used as a hydrocarbon compound, the contact angle to hexadecane of the lipophilic region is preferably at least 40°, more preferably at least 60°, particularly preferably at least 70°.

In the production of the treated substrate of the present invention, if light or laser for photopolymerization is applied though a photomask at a time of light irradiation, a treated substrate on which a desired pattern of a hydrophilic region and a water repellent region is formed can be obtained. Further, it is possible to form a pattern such that width between the hydrophilic region and the water repellent region is at most 10 µm.

A member on which a pattern of a film made of a functional material is formed can be produced by applying a hydrophilic liquid containing a functional material on a surface of the treated substrate of the present invention in order to coat the hydrophilic region of the treated substrate on which a pattern is formed with the hydrophilic liquid, followed by drying.

The functional material may, for example, be a metal particles-dispersed paste for forming metal wiring, a pigment material for forming a color filter, a ceramic material for forming an electronic device or an organic display or a semiconductor material.

The hydrophilic liquid containing a functional material means a liquid wherein a functional material is dissolved in water or a high polar organic solvent. A high polar organic solvent which is miscible with water is more preferred.

The coating method may, for example, be a coating method such as a spin coating, a dip coating, wire bar coating, blade coating or roll coating or a printing method for a specific region such as screen printing or inkjet printing. Among them, from the viewpoint of selectively coating a non-water repellent region on a pattern of a water repellent region and a hydrophilic region, screen printing or inkjet printing is preferred.

The drying is preferably carried out in atmosphere, nitrogen stream or the like. Further, the drying is preferably carried out at room temperature or under heating. In a case where the drying is carried out under heating, it is preferred that the temperature and time are optionally changed, depending on the heat resistance of a material of a substrate.

As mentioned above, for electronic elements, a member on which a pattern of a film made of a functional material is formed and of which water repellent film is removed is useful. It is preferred that the water repellent film is removed by carrying out an UV/O$_3$ treatment on the member. For example, it is preferred that PL7-200 (manufactured by CENT ENGINEERING CO., LTD.) is used, and a member is irradiated for from 1 to 3 minutes.

In a case where the treated substrate of the present invention is stained with a hydrophilic ink as a functional material, the member can be used as a stump. Further, in a case where a pattern of a hydrophilic region and a water repellent region is preciously formed, it can be used as a stump for microcontact printing.

Further, in a case where a flexible substrate such as a plastic substrate is used as a substrate, by irradiating the substrate with light by installing plural rolls and an exposure apparatus between the plural rolls so that Roll to Roll method can be carried out, a photo-treated substrate can be obtained with a high throughput.

EXAMPLES

Now, the present invention will be described in further detail with reference to Examples, but it should be understood that the present invention is by no means restricted thereto.

The contact angle to water was measured by putting water droplets on 3 different spots on a surface of a substrate to be measured, and each droplet was measured in accordance with JIS R3257 "sessile drop test method of a glass substrate surface". The droplet was 2 µL/droplet, and the measurement was carried out at 20° C. The contact angle is represented by an average value of 3 droplets (n=3).

Example 1

Substrate Wash

A 5 cm$^2$ silicon wafer was washed with ethanol and then washed with UV/O$_3$.
Preparation of a Coating Solution
2.5 g of isopropanol was added in a sample vessel. 0.1 g of a 10 mass % isopropanol solution of a polydimethyl siloxane having methacryloyloxy propyl groups at both terminals (DMS-R18, manufactured by Gelest, Inc., the compound of the formula (21) wherein R$^1$ is a methyl group, Q$^1$ is a methyl group, k is 3, and the molecular weight is from 4,500 to 5,500) was added to the sample vessel. 0.2 g of a 1 mass % isopropanol solution of trimethylol propane triacrylate was added. 0.06 g of a 1% isopropanol solution of IRGACURE 369 (manufactured by CIBA-GEIGY Limited) was added as a photopolymerization initiator. The sample vessel was shaken a few times to mix the solution.
Coating with a Solution
The silicon wafer was coated with the prepared coating solution by spin coating under a condition of 3000 rpm for 20 seconds, and a film was formed.
Light Irradiation
A surface of the obtained film was irradiated with ultraviolet light of a high-pressure mercury lamp at 5 mw/cm$^2$ for 15 seconds under nitrogen atmosphere from the film side through a photomask having a pore pattern of 2.5 cm×5 cm.
Substrate Wash
After the light irradiation, the substrate was rinsed with isopropanol, then rinsed with ethanol and dried under nitrogen stream, whereby a treated substrate was obtained.
Film Thickness Measurement
The film thickness of the obtained treated substrate was measured by Atomic Force Microscope (AFM), and as a result, the thickness of the water repellent film was 8 nm.
Measurement of Contact Angle
With respect to the surface of the treated substrate obtained by the above step, the contact angle to water was 28° at a non-irradiated part and 100° at an ultraviolet light irradiated part. Therefore, a water repellent-hydrophilic pattern having a hydrophilic region (contact angle: 28°) and a water repellent region (contact angle: 100°) was confirmed. The film thickness of the water repellent region was 38 nm.

Example 2

The same operation was carried out as in Example 1, except that IRAGARACURE 907 (manufactured by CIBA-GEIGY Limited) was used, instead of IRAGARACURE 369. The thickness of the obtained film was 8 nm.

The contact angle to water of the obtained treated substrate was 21° at a non-irradiated part and 100° at an ultraviolet light irradiated part. Therefore, a water repellent-hydrophilic pattern having a hydrophilic region (contact angle: 21°) and a water repellent region (contact angle: 100°) was confirmed.

Example 3

The same operation was carried out as in Example 2, except that 0.5 g of a 1% aqueous solution of a polyvinyl alcohol (molecular weight: 500, manufactured by KANTO CHEMICAL CO., INC.) was added to a coating solution, and after spin coating, the substrate was left to stand still for 5 minutes. The thickness of the obtained film is estimated to be about 12 nm.

The contact angle to water of the obtained treated substrate was 29° at a non-irradiated part and 100° at an ultraviolet light irradiated part. Therefore, a water repellent-hydrophilic pattern having a hydrophilic region (contact angle: 29°) and a water repellent region (contact angle: 100°) was confirmed.

Example 4

The same operation was carried out as in Example 2, except that before the substrate is coated with a coating solution, the substrate was coated with 2 mL of a 1 mass % aqueous solution of a polyvinyl alcohol (molecular weight: 500, manufactured by KANTO CHEMICAL CO., INC.) by spin coating (3,000 rpm, 20 seconds). The thickness of the obtained film was estimated to be about 12 nm.

The contact angle to water of the obtained treated substrate was 29° at a non-irradiated part and 100° at an ultraviolet light irradiated part. Therefore, a water repellent-hydrophilic pattern having a hydrophilic region (contact angle: 29°) and a water repellent region (contact angle: 100°) was confirmed.

Example 5

0.1 g of $NH_2CH_2CH_2CH_2$—$Si(OCH_2CH_3)H_3$ (manufactured by Shin-Etsu Chemical Co., Ltd.) was dissolved in 100 g of isopropanol, and 0.025 g of distilled water was added thereto, followed by stirring at room temperature for 20 hours to obtain an amino silicone solution.

The same operation was carried out as in Example 2, except that before the substrate is coated with a coating solution, the substrate was coated with 20 mL of the above prepared amino silicon solution by spin coating (3,000 rpm, 20 seconds). The thickness of the obtained film was estimated to be about 15 nm.

The contact angle to water of the obtained treated substrate was 11° at a non-irradiated part and 102° at an ultraviolet light irradiated part. Therefore, a water repellent-hydrophilic pattern having a hydrophilic region (contact angle: 11°) and a water repellent region (contact angle: 102°) was confirmed.

Example 6

The same operation was carried out as in Example 1, except that instead of IRAGACURE 369, IRAGACURE 907 was used, instead of trimethylol propane triacrylate, dipentaerythritol hexaacrylate was used, and instead of the nitrogen atmosphere, light irradiation was carried out under air atmosphere. The thickness of the obtained film was about 8 nm.

The contact angle to water of the obtained treated substrate was 19° at a non-irradiated part and 100° at an ultraviolet light irradiated part. Therefore, a water repellent-hydrophilic pattern having a hydrophilic region (contact angle: 19°) and a water repellent region (contact angle: 100°) was confirmed.

INDUSTRIAL APPLICABILITY

According to the production process of the present invention, a fine pattern having a hydrophilic region and a water repellent region can be formed without employing a large facility, a vacuum apparatus and a light source. In a case where a functional ink is spread on the pattern by using an ink-jet, since only a hydrophilic region is coated with the functional ink, and a water repellent region is not coated with the functional ink, patterning can be carried out on a substrate with a functional ink. Further, the present invention can also be applied for forming electronic device circuits. Further, a thin film having a water repellent-hydrophilic pattern can be used as a stump for micro contact printing, by dyeing a hydrophilic region with a functional ink and transcribing it.

Further, a treated substrate having a hydrophilic region and a water repellent region on a surface can be used in a medical field. For example, a mask having a pattern such that a blood vessel of a capillary vessel corresponds to a hydrophilic part is prepared, and a pattern of a capillary vessel is printed on a substrate. Vascular endothelial cells are spread thereon, and the cells grow only on the hydrophilic region, whereby a pattern of a capillary vessel can be regenerated.

Further, in a case where a compound wherein the compound (a) having a water repellent property and no oil repellent property (for example, a fluorine-containing hydrocarbon water repellent compound) is used, since a water repellent region is also a lipophilic region, an oil ink can be contained at the lipophilic region, and a substrate can be used as a platemaker for print.

Further, in the treated substrate of the present invention having a hydrophilic region and a water repellent region on a surface of a substrate, by utilizing a reactivity of a hydroxyl group, etc. on a surface of a hydrophilic region, a compound having another property can react on the surface of the hydrophilic region, whereby a substrate having a water repellent property and another property can be formed.

The entire disclosure of Japanese Patent Application No. 2006-059495 filed on March 6, including specification, claims and summary is incorporated herein by reference in its entirety.

What is claimed is:

1. A treated substrate having a hydrophilic region and a water repellent region on a surface of a substrate, wherein the water repellent region comprises a water repellent film formed by curing the following composition (A) and having a film thickness of from 0.1 to 100 nm:
    composition (A): a composition comprising a photopolymerization initiator; a compound (a) having at least one polymerizable functional group selected from the group consisting of an acryloyl group and a methacryloyl group, and a water repellent moiety; and a compound (b) having at least three polymerizable functional groups selected from the group consisting of an acryloyl group and a methacryloyl group, provided that the compound (b) may be the same as the compound (a) or a compound other than the compound (a).

2. The treated substrate according to claim 1, wherein the compound (a) is a compound represented by the following formula (11), (12), (21) or (22):

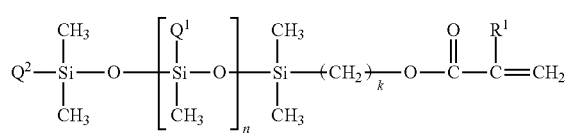
(11)

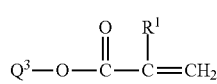
(12)

-continued

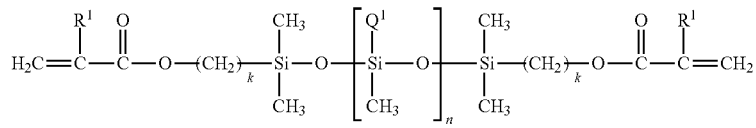

(21)

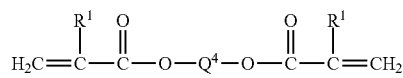

(22)

where each of $Q^1$ and $Q^2$ which are independent of each other, is a monovalent organic group, $Q^3$ is an alkyl group having at least four carbon atoms, a monovalent organic group having the above alkyl group as a partial structure, a fluoroalkyl group having at least one carbon atom, which may contain an etheric oxygen atom, or a monovalent organic group having the above fluoroalkyl group as a partial structure, $Q^4$ is an alkylene group having at least four carbon atoms, a bivalent organic group having the above alkylene group as a partial structure, a fluoroalkylene group having at least two carbon atoms, which may contain an etheric oxygen atom, or a bivalent organic group having the above fluoroalkylene group as a partial structure, $R^1$ is a hydrogen atom or a methyl group, n is an integer of at least 0, and k is an integer of from 1 to 5.

3. The treated substrate according to claim 2, wherein compound (a) is represented by formula (11).

4. The treated substrate according to claim 3, wherein each of $Q^1$ and $Q^2$ is a methyl group.

5. The treated substrate according to claim 2, wherein compound (a) is represented by formula (12).

6. The treated substrate according to claim 5, wherein $Q^3$ is a group represented by $R^{f1}$—Y—, wherein $R^{f1}$ is a $C_{1-12}$ perfluoroalkyl group, and Y is a bivalent coupling group containing no fluorine atom.

7. The treated substrate according to claim 2, wherein compound (a) is represented by formula (21).

8. The treated substrate according to claim 7, wherein $Q^1$ is a methyl group.

9. The treated substrate according to claim 2, wherein compound (a) is represented by formula (22).

10. The treated substrate according to claim 1, wherein the contact angle of the hydrophilic region to water is at most 50°, and the contact angle of the water repellent region to water is at least 80°.

11. The treated substrate according to claim 1, wherein the hydrophilic region and the water repellent region have a predetermined pattern.

12. The treated substrate according to claim 1, wherein the substrate is selected from the group consisting of glass, silicon, metal oxide and polyimide.

* * * * *